United States Patent
Reynolds et al.

(10) Patent No.: US 8,120,245 B2
(45) Date of Patent: Feb. 21, 2012

(54) INTERDIGITATED ELECTRODE DUAL ELECTROEMISSIVE/ELECTROCHROMIC DEVICES

(75) Inventors: John R. Reynolds, Gainesville, FL (US); Aubrey Lynn Dyer, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 12/936,854

(22) PCT Filed: Apr. 15, 2009

(86) PCT No.: PCT/US2009/040590
§ 371 (c)(1), (2), (4) Date: Nov. 1, 2010

(87) PCT Pub. No.: WO2009/129275
PCT Pub. Date: Oct. 22, 2009

(65) Prior Publication Data
US 2011/0062860 A1    Mar. 17, 2011

Related U.S. Application Data

(60) Provisional application No. 61/124,382, filed on Apr. 15, 2008.

(51) Int. Cl.
*H01J 1/62* (2006.01)
*G02F 1/153* (2006.01)
*H01L 29/04* (2006.01)

(52) U.S. Cl. ........ 313/504; 359/267; 359/265; 257/296; 257/E33.013

(58) Field of Classification Search .................. 313/504, 313/506, 512; 257/296, E33.013, E21.09; 359/267, 265, 237
See application file for complete search history.

(56) References Cited

U.S. PATENT DOCUMENTS

| 7,002,723 B2 | 2/2006 | Enomoto et al. |
| 7,184,191 B2 | 2/2007 | Mizuno et al. |
| 7,333,257 B2 | 2/2008 | Reynolds et al. |
| 2007/0257263 A1 | 11/2007 | Enomoto et al. |

FOREIGN PATENT DOCUMENTS

| JP | 1997-325348 | 12/1997 |
| JP | 2002-050486 | 2/2002 |
| JP | 2005-128062 | 5/2005 |
| JP | 2005-292258 | 10/2005 |
| JP | 2005-294066 | 10/2005 |
| JP | 2006-113355 | 4/2006 |

(Continued)

OTHER PUBLICATIONS

Enomoto, S. et al., "Electrochemical Reaction Display with Dual Reflective and Emissive Modes," *SID 07 Digest*, 2007, pp. 1817-1820.

Shin, J-H. et al., "Light Emitting Electrochemical Cells with Millimeter-Sized Interelectrode Gap: Low-Voltage Operation at Room Temperature," *J. Am. Chem. Soc.*, 2006, pp. 15568-15569, vol. 128.

(Continued)

*Primary Examiner* — Joseph L Williams
(74) *Attorney, Agent, or Firm* — Saliwanchik, Lloyd & Eisenschenk

(57) ABSTRACT

A dual electrochromic/electroluminescent (EC/EL) device of at least one pixel includes an interdigitated electrode where an electroactive layer is dispersed on and between the digits of the two electrodes of the interdigitated electrode. The electroactive layer is in contact with an electrolyte layer that also contacts a third electrode. The device acts as an electroluminescence device when an electrical bias between the two electrodes of the interdigitated electrode is established. The device acts as an electrochromic device when the electrical bias is established between the combined electrodes of the interdigitated electrode and the third electrode.

21 Claims, 5 Drawing Sheets

FOREIGN PATENT DOCUMENTS

| | | |
|---|---|---|
| JP | 2006-301302 | 11/2006 |
| JP | 2007-286561 | 11/2007 |
| WO | WO 2006-045043 | 4/2006 |

OTHER PUBLICATIONS

Wang, X.J. et al., "Display device with dual emissive and reflective modes," *Applied Physics Letters*, 2005, pp. 113502-1-113502-3, vol. 87.

INTERDIGITATED ELECTRODE DUAL ELECTROEMISSIVE/ELECTROCHROMIC DEVICES

CROSS REFERENCE TO RELATED APPLICATIONS

This application is the U.S. national stage application of International Patent Application No. PCT/US2009/040590, filed Apr. 15, 2009, which claims the benefit of U.S. Provisional Application Serial No. 61/124,382, filed Apr. 15, 2008, the disclosures of which are hereby incorporated by reference in their entireties, including any figures, tables, or drawings.

BACKGROUND OF THE INVENTION

Electroluminescence is the emission of light from an electroactive material upon the application of a sufficient voltage to cause charge carrier (hole/electron) injection at the electrode (anode/cathode). Charge carrier injection is followed by charge migration through the electroactive material under the influence of an applied electric field. When the holes and electrons meet, they recombine, emitting light. The color of the light emitted depends on the bandgap (or HOMO-LUMO gap) of the material and can span the entire visible region of the spectrum. Many luminescent displays, such as those in PDAs and cell phones that contain OLED displays, operate in this manner. Another luminescent display is the light-emitting electrochemical cell (LEC). This device differs in that it contains ionic species in the electroactive layer that help lower the barrier for charge injection, allowing for the use of non-reactive electrode materials.

Another type of display for consumer electronics (e-books, electronic paper, reflective LCDs) is a reflective display, which can be based on electrochromics. Electrochromism is the change in color of an electroactive material induced by the reduction or oxidation of an electrochrome at an electrode surface. This color change can be between multiple color states or from a colored state to a transmissive state. Typical electrochromic displays contain an electroactive, electrochromic material at a working electrode and at a counter electrode where the electrodes are in contact with an interdisposed electrolyte. These displays can be of a transmissive window-type, where both electrodes are transmissive, or of a reflective mirror-type, where one electrode is reflective.

For consumer electronic devices (e.g., cell phones, PDAs, mp3 players, and digital cameras), the displays typically are one of three types: reflective displays (i.e., reflective LCDs, IMOD, e-paper); transmission (i.e., transmissive LCDs); or light emission (i.e., OLEDs). One drawback exhibited by such displays is that the device is often used in a variety of environments with varying degrees of ambient light. For the transmissive or emissive displays, outdoor ambient lighting frequently overwhelms the display back-light resulting in a washed-out image. In contrast, low ambient lighting does not allow sufficient contrast with a reflective display without the use of an added light source. Hence, a display that can effectively function in a variety of lighting conditions by switching between a full color reflective electrochromic operation and a light-emitting operation would be advantageous.

BRIEF SUMMARY OF THE INVENTION

The invention is directed to a dual electrochromic/electroluminescence (EC/EL) device that is at least one pixel, where the pixel includes an interdigitated electrode that has a first electrode with a plurality of digits and a second electrode with a plurality of digits where an electroactive layer is disposed on and between the electrodes of the interdigitated electrode, a third electrode, and an electrolyte comprising layer disposed on and between the electroactive layer and the third electrode. The electroactive layer provides electrochromic activity to the device when an electrical bias is established between the interdigitated electrode and the third electrode, and electroluminescence, when an electrical bias is established between the first and second electrodes of the interdigitated electrode. The interdigitated electrode, or the third electrode and/or its supporting substrate can be transparent.

The digits of the first and second electrodes of the interdigitated electrode can be independently gold, platinum, palladium, ITO, carbon nanotubes, or PEDOT:PSS. The electroactive layer can be a metal complex, a metal complex-containing polymer, or a conjugated polymer, which can be blended with a matrix polymer. For example the transition metal complex $Ru(bpy)_3(PF_6)_2$ can be blended with the matrix polymer polymethylmethacrylate (PMMA). For example, the metal complex-containing polymer can be a homo- or copolymerized crosslinkable bis-acrylate-bpy-Ru(bpy)2 salt, or the condensation polymer from a diol or diester-bpy-Ru(bpy)2 salt. As in this example, the electroactive layer can contain an electrolyte, and the electrolyte can be a solid electrolyte, a gel electrolyte, or an ionic liquid. The electrolyte comprising layer can be a gel electrolyte, a solid electrolyte, or an ionic liquid. The device can include a means of applying an electrical bias between the combined first and second electrodes and the third electrode, and an electrical bias between the first and second electrodes.

The dual EC/EL device can include a second electroactive layer disposed on the third electrode between the third electrode and the electrolyte comprising layer. The second electroactive material can be a redox active polymer, for example a conjugated polymer such as poly(3,4-ethylenedioxythiophene) (PEDOT). In one embodiment the interdigitated electrodes or the third electrode, alone or combined with the supporting substrate, is specular reflective and the electroactive layer and the second electroactive layer have an electrochromic mode where both of the layers have a colorless transparent state.

In another embodiment the dual EC/EL device includes a porous spacer within the electrolyte comprising layer where the porous spacer can be specular or diffuse reflective. The porous spacer can be fabricated from cellulose or polytetrafluoroethylene.

In another embodiment of the invention the interdigitated electrode or the third electrode, either alone or combined with the supporting substrate, is reflective. The reflective electrode or substrate can be specular reflective and the electroactive layer can have a colorless transparent electrochromic mode such that the device can be used as a mirror.

DETAILED DESCRIPTION OF THE INVENTION

The invention is directed to a device that allows selective electrochromism (EC) and electroluminescence (EL) from a single pixel from a single electroactive layer, referred to hereafter as an active layer. The device combines an electrochromic device (ECD) with a light-emitting electrochemical cell (LEC). The dual EC-EL effect from a single active film material allows an especially facile device production. Depending upon the arrangement of electrode contact, the mode of operation can be either EC or EL. Although light, luminescence, chromism, transmission, transparency, emission, and reflection are often in reference to a wavelengths of the visible spectrum, for the purposes of the invention these terms can refer to any portion of the electromagnetic spectrum that a device is intended to operate, for example these terms can be used in reference to any portion of the infrared, visible and/or ultraviolet spectrum that a device is designed to actively display. The viewer of such a display can be any detecting device as well as an eye.

Current electrochromic or reflective-type displays for use in consumer electronic devices require either high ambient lighting or an external lighting source for the display to be viewed. Displays that operate in an emissive mode (such as transmissive LCDs or OLEDs) do not operate effectively in lighting situations where the ambient lighting is brighter than the light emitted from the display, such as outdoors in direct sunlight. As the devices of the present invention allow both electrochromic operation and electroluminescent emission from the same pixel and the same active layer, operation can be carried out in an emissive mode in low ambient lighting situations and a reflective electrochromic mode in high ambient lighting situations. Additionally, the display does not require any additional light source as is common for many displays utilized in modern consumer electronics.

Figure 1:
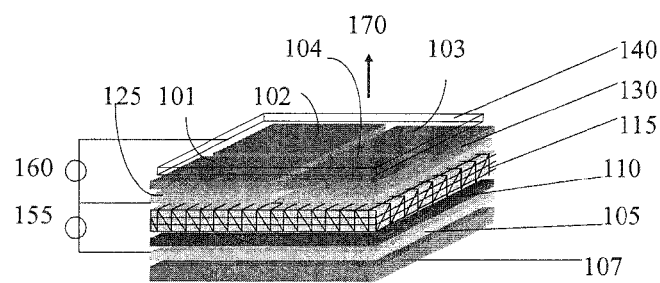
FIG. 1 is a drawing of a prior art dual electrochromic/electroluminescent (EC/EL) device employing multiple stacked electrodes.

A prior art dual EC/EL device is shown schematically in FIG. 1 and disclosed in Reynolds, WO 2006/045043, filed Oct. 20, 2005 and is incorporated by reference herein. Reynolds describes an active layer 130 that is cast onto a transparent electrode 140 that acts as a working electrode during electrochromic operation and as an anode during electroluminescent operation. Electrode 130 contacts a conducting porous membrane 125 that acts as a cathode during electroluminescent operation and can act as the working electrode rather than 130 during electrochromic operation. Electrode 125 may be patterned using the method disclosed in Reynolds et al. U.S. Pat. No. 7,333,257 filed Nov. 19, 2004 and incorporated by reference herein. A third electrode 105 is the counter electrode for electrochromic operation. The device is filled with a gel electrolyte or solid electrolyte between each electrode layer. When 140 and 125 are biased, the device operates in emissive mode. When 140 (or 125) and 105 are biased, the device operates in color changing electrochromic mode.

In contrast to the device of Reynolds et al., the device of the present invention differs in the number, placement, and nature of the electrodes. The inventive device employs a patterned interdigitated electrode on a substrate intimately contacting an active layer of material that exhibits both electroluminescence and electrochromic behavior. The interdigitated electrode comprises two electrodes formed on a common surface of a substrate, and although the surface is often a planar surface, the surface can have any topography that avoids direct contact of the two electrodes and allows required contact with other components of the device. In the interdigitated electrode 1/2 one set of digits comprise electrode 1 (indicated as 201, 301, 401, 501 and 601 in FIGS. 2-6, respectively) and another set of digits comprise electrode 2 with patterned digits of the conductors alternating in position upon a substrate 4, as indicated in FIGS. 2 through 6. During electroluminescent operation, one set of digits of the interdigitated electrode act as the anode and the other set of digits act as the cathode and electroluminescence occurs in the material of the active layer 5 between the digits. The spacing between these digits can be from about a micron to about a millimeter in distance. For electrochromic operation, electrodes 1 and 2 are connected, shorted, to operate as a single working electrode and electrode 3 operates as a counter electrode. The electrochromism occurs on and between the digits in the active layer 5 of the interdigitated electrode.

The interdigitated electrode on one surface provides dual EC/EL capabilities while avoiding poor contact and connection issues between a flexible porous electrode and a rigid planar electrode that can occur between separated Electrode I and Electrode II, as in the prior art design. The present invention advantageously has an interdigitated electrode 1/2, where, particularly during EL operation, the electrodes are on a single surface. Other advantages to the devices of the present invention are that the electrodes and active layer 5 can be processed by spray-coating, spin-coating, screen-printing, and a variety of other methods. Additionally, all electrodes can be mechanically flexible when constructed on flexible substrates. The devices of the present invention can be all-polymeric where the interdigitated electrode layer and the counter electrode are comprised of a conducting polymer solution cast onto plastics.

The sets of digits of the interdigitated electrode 1/2 can comprise patterned gold, ITO, PEDOT:PSS, or any other conductor. As used herein, where an interdigitated electrode 1/2 is referred to as reflective or transmissive, the supporting substrate 4 for the interdigitated electrode must be reflective or transmissive, but depending on the size and spacing of the digits, the digits of one or both of the electrodes 1 and 2 of the interdigitated electrodes can be an opaque reflective or transmissive material. The dimensions of the digits and the spacing of the digits can be such that sufficient light can be transmitted through the digits and diffraction of light by the digits does not adversely affect the desired quantity or appearance of the light passing through the interdigitated electrode 1/2. Alternately, the spacing and dimensions of the digits can be of dimensions such that the interdigitated electrode 1/2 displays a desired degree of opacity, reflectance, or diffraction. Such effects can be augmented by the nature of the materials used to construct the interdigitated electrodes, as would be appreciated by one skilled in the art. For example, the electrodes 1 and 2 can be constructed of a transparent material with rather large dimensions and the supporting substrate 4 is reflective. Herein, such an interdigitated electrode is referred to as being reflective. Alternately, opaque digits of sufficiently small dimensions and wide spacing can be supported by a transparent supporting substrate 4, such that sufficient light is transmitted between the digits and through the supporting substrate 4. Herein such an interdigitated electrode 1/2 is referred to as transparent.

The electrochromic and electroluminescent active layer 5 contacting the interdigitated electrode 1/2 can comprise any dual active material. Such materials include transition metal complexes blended into a matrix polymer (e.g., [Ru(bpy)$_3$(PF$_6$)$_2$]/polymethylmethacrylate (PMMA)) or a conjugated electroactive polymer blended with a solid electrolyte (e.g., poly[2-methoxy-5-(2-ethylhexyloxy)-1,4-phenylenevinylene] (MEH-PPV), poly(ethylene oxide) (PEO), and Lithium Triflate (LiOTf)). Electrode 3 can include an electroactive polymer layer 7 cast onto a conductor 6 to act as a counter electrode during electrochromic operation. Positioned between the interdigitated electrode 1/2 and electrode 3 is an electrolyte comprising layer (not shown), which can be a gel electrolyte, a solid electrolyte, or an ionic liquid.

Figure 2:
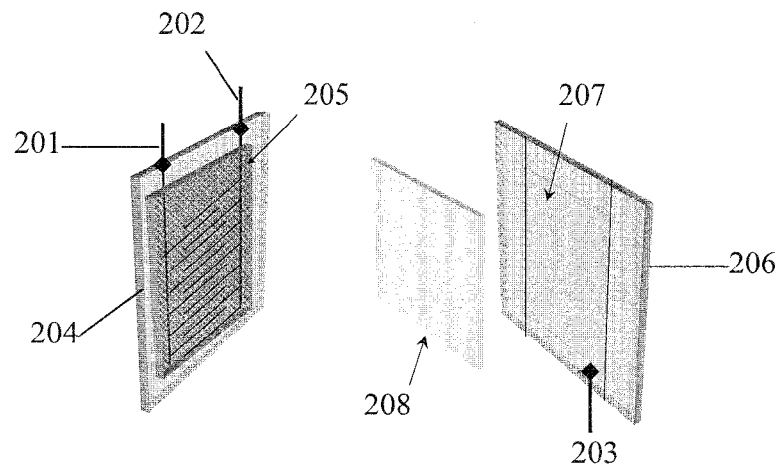
FIG. 2 is a drawing of an EC/EL reflective device according to an embodiment of the invention with a diffuse reflective surface.

In one embodiment of the invention, illustrated in FIG. 2, the substrate 204 supporting electrodes 201/202 of the interdigitated electrode, in contact with the active layer 205, which exhibits both electroluminescence and electrochromic behavior, are transmissive and Electrode 203 in contact with a counter polymer 207 and/or any supporting substrate 206 can be either reflective or transmissive. An electrolyte-soaked porous diffuse reflector 208 is placed between the interdigitated electrodes 201/202 and electrode 203. This reflector 208 can comprise any material that is diffuse reflective and allows ion transport. For example, cellulose or Teflon membranes can be used. The diffuse reflective material can be a white reflector or the material can be any color.

Figure 3:
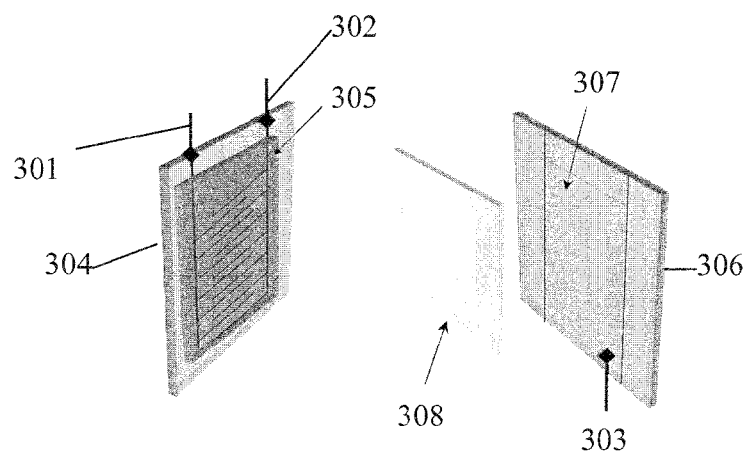
FIG. 3 is a drawing of an EC/EL reflective device according to an embodiment of the invention with a specular reflective surface.

In another embodiment of the invention, illustrated in FIG. 3, a porous reflector 308 is coated with a metallic layer (e.g., gold on polycarbonate membrane) or other reflective material to provide specular, mirror-like, reflection while using an equivalent interdigitated electrode 301/302 in contact with the active layer 305 and electrode 303 of the embodiment illustrated in FIG. 2. It should be noted that the metalized reflector 308 is not electrically connected in a manner to be an electrode, but rather to provide a mirror-like reflective surface while maintaining ionic diffusion.

Figure 4:
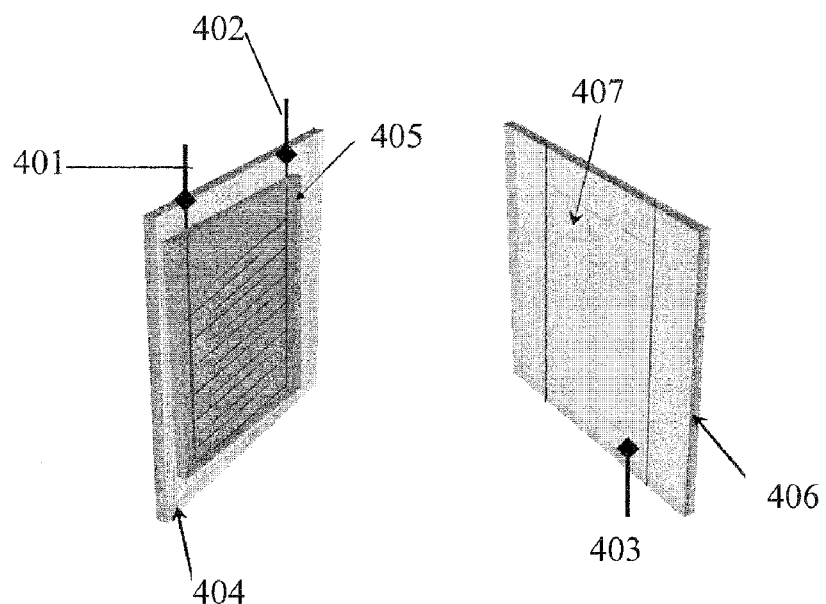
FIG. 4 is a drawing of an EC/EL transmissive device according to an embodiment of the invention.

In another embodiment of the invention, illustrated in FIG. 4, no porous separator layer is used, and the interdigitated electrodes 401/402 in contact with the active layer 405 and Electrode 403 are constructed on transmissive substrates 404 and 406 with any counter-polymer 407 of electrode 403 comprising a transparent material. In this embodiment, the device acts as an electrochromic window with the colors exhibited being a combination of the colors exhibited by the polymers of the active layer 405, working interdigitated electrode 401/402 and the counter polymer 407 of the counter electrode 403. When in an emissive mode, emission from the active layer 405 of the interdigitated electrode 401/402 can be seen through both sides of the device.

Figure 5:
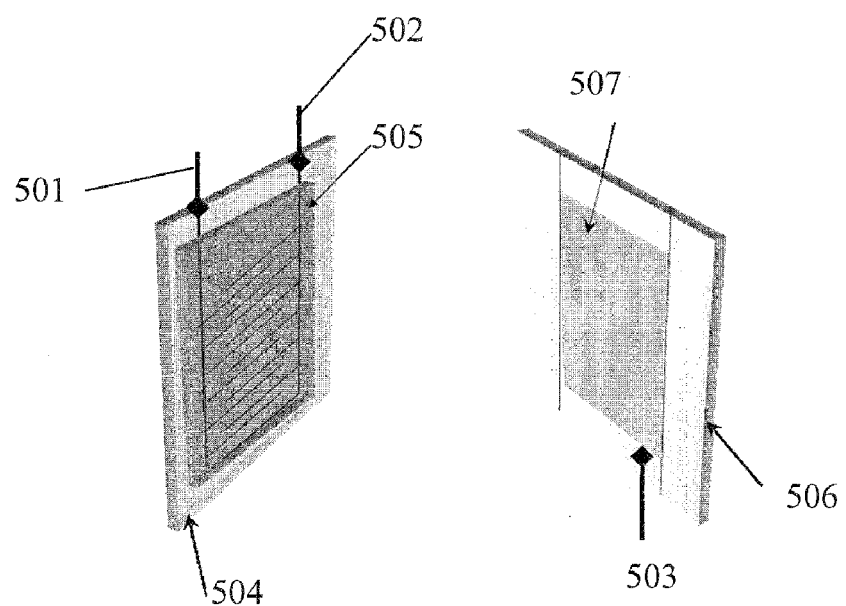
FIG. 5 is a drawing of an EC/EL reflective device according to an embodiment of the invention with a reflective surface.

In another embodiment of the invention, illustrated in FIG. 5, no porous separator exists and the substrate 506 or the counter polymer of electrode 503 is reflective. The color displayed in the electrochromic mode will be a combination of those exhibited by the active layer 505 at the interdigitated electrodes 501/502 and electrode 503 due to the reflection from electrode 503.

Figure 6:
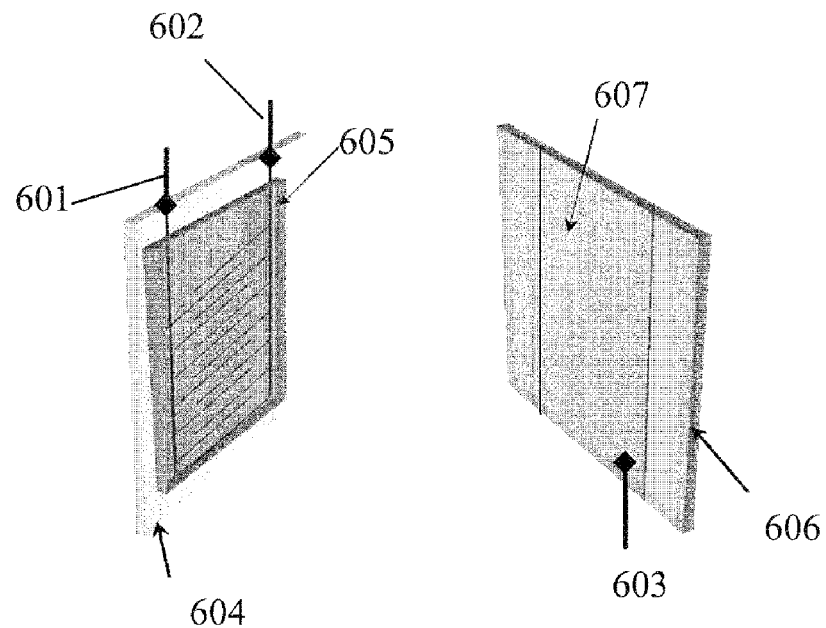
FIG. 6 is a drawing of an EC/EL reflective device according to an embodiment of the invention with a reflective surface.

In another embodiment of the invention, illustrated in FIG. 6, the substrate 604 of the interdigitated electrode 601/602 is reflective and the colors are observable through electrode 603 when any counter polymer 607 and substrate 606 are transmissive materials. In this embodiment, or in embodiments illustrated in FIG. 3 and FIG. 5 where a specular reflective surface is employed, the devices can be constructed with electrochromic materials of the active layer 605 that can achieve a colorless state, which when all materials are in a transmissive colorless state, a highly reflective metallic mirrored surface is revealed to the observer of the device. Hence, the device can be switched between an emitting display, an electrochromic display, and a mirrored surface, allowing the display device to be used as a mirror when desired. For the device of FIG. 3, an electrochromic/electroluminescent material that can switch to a transparent state is required for the achievement of a mirror display. Devices of FIG. 5 and FIG. 6 require that the active layer and any counter polymer on a counter electrode can achieve transparent states simultaneously to expose a reflective substrate 506 or 604.

In the embodiments illustrated in FIGS. 2 through 6, a gasket at the edges of the device or beads of a uniform diameter (not shown) can be used as a spacer between the interdigitated electrode and any surface facing it, whether it is the counter electrode 3, a reflective porous membrane 208 or 308, or a porous separator.

The dual EC/EL devices of the present invention can be coupled with one or more light sensors to detect the intensity of ambient light and provide a control signal to switch the applied electrical bias and alter the device between an EC and an EL mode such that the switching can be carried out automatically. The electrical bias can be supplied by any means, such as at least one power supply, and can be a switched power supply comprising at least one switch. In this manner, the display will be automatically in the mode most appropriate for the ambient light striking the observed display surface at all times. Light sensors can be any variety known in the art and can include devices based on photodiodes, photoresistors, phototransistors, or CCDs.

Transparent electrodes can include conductive glasses or non-conductive materials that have a surface rendered conductive by a coating of a conductive glass, a conductive polymer, a conductive carbon, or a sufficiently thin metal coating. Many examples of such materials are known in the art. An exemplary conductive glass is indium-tin-oxide (ITO). An exemplary conductive polymer is poly(3,4-ethylenedioxythiophene)/polystyrenesulfonate (PEDOT/PSS). An exemplary conductive carbon is a film of single walled carbon nanotubes (SWNT). An exemplary thin metal coating is a thin gold coating (<300 angstroms). Non-conductive transparent materials that can be coated by a conductive material include glass and transparent plastics, such as PMMA and polycarbonate. By using transparent plastics, combined with other appropriate plastic or polymeric materials, flexible displays can be fabricated.

Figure 8:
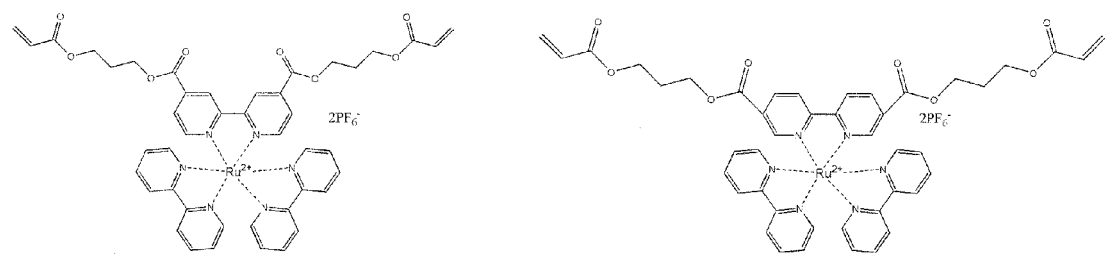
FIG. 8 shows the structure of a crosslinkable para and meta bis-acrylate-bpy-Ru(bpy)2 salt monomers for the preparation of metal complex-containing crosslinked polymers according to an embodiment of the invention.
Figure 9:
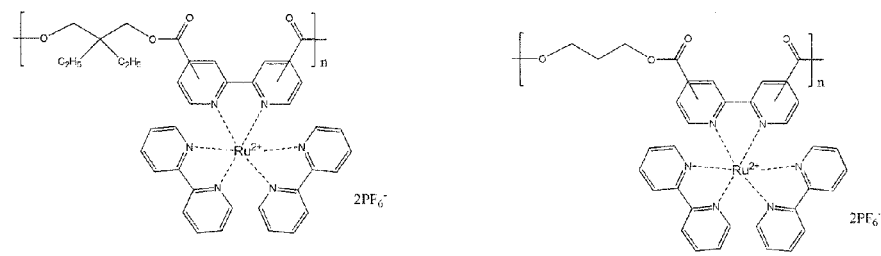
FIG. 9 shows the structure of two polyesters containing bis-acrylate-bpy-Ru(bpy)2 salt repeating units according to an embodiment of the invention.

Electroactive materials that exhibit both electrochromic activity and electroluminescence include, in one embodiment, metal complexes tris(2,2'bipyridyl)ruthenium[II] hexafluorophosphate (Ru(bpy)$_3$(PF$_6$)$_2$ and tris[bis(ethoxy-carbonyl)-2,2'-bipyridyl] ruthenium[II] hexafluorophosphate Ru(bec-bpy)$_3$(PF$_6$)$_2$ and other ionic transition metal oxides. These metal complexes, although they can be employed alone, are advantageously combined with a polymer matrix such as PMMA, polystyrene, or polycarbonate. Additionally, while the transition metal complexes are inherently ionic and mobile, allowing ionic redistribution during charging of the electrodes, additional ionic components can be added to the active layer. These additional ionic components include salts, such as lithium triflate (LiOTf) and tetrabutylammonium hexafluorophosphate (TBAPF$_6$), or ionic liquids, such as 1-butyl-3-methylimidazolium tetrafluoroborate ([bmim][BF$_4$]). To allow for better film formation, the transition metal complex can be incorporated into a polymer as a pendant group or by having at least one functional group on a ligand of the complex to allow for thermal or photoinitiated cross-linking. For example, in one embodiment of the invention, a cross-linked polymer can be formed by homo- or copolymerizing a bis-acrylate-bpy-Ru(bpy)2 salt, for example, as shown in FIG. 8. In another embodiment of the invention a linear polymer can be formed containing a Ru(bpy)2 salts, for example the condensation polyester from a diol or, as shown in FIG. 9, diester-bpy-Ru(bpy)2 salt comprising monomer. One skilled in the art can readily appreciate that the embodiments are not limited to the recited of Ru salts, to ligands being bipyridyl ligands or that the counter ions are limited to triflates, hexafluorophosphates, or tetrafluoroborates, but includes many other transition metals, bidentate or polydentate ligands, and counter anions that are non-nucleophilic to the metals, components of the active layers, electrolytes or other parts of the devices.

In another embodiment of the invention the materials that are dual EC/EL include conjugated polymers such as poly(bis-substituted-phenylene-alt-N-substituted carbazole), poly(3-substituted-thiophene-alt-N-substituted carbazole), poly(3-substituted-thiophene), poly(bis-alkylenedioxythiophene-N-substituted carbazole), poly(N,N-disubstituted-fluorene-alt-N-substituted carbazole), and poly(disubstituted-phenylenevinylene) where substituents can be independently oligo(ethyleneoxide) or other alkyl, alkoxy groups and alkylene units can be ethylene, propylene or butylene units and, where not indicated, substitution can be at any substitutable carbon of the polymer. In another embodiment of the invention the conjugated polymer can be blended with a non-conductive material, including polymers such as PMMA and polyethyleneoxide (PEO). To allow for charge balance during oxidation and reduction of the conjugated polymer, ionic species are added to the polymer blend, where the ionic species can be any added salts or ionic pendant groups on the polymer backbone. The electroactive material at the counter electrode 3 can be one that acts as a cathodically coloring polymer or an anodically coloring polymer, as will be obvious to one skilled in the art.

The devices of the present invention can be employed for electrochromic and/or light-emitting displays embedded in personal electronic devices such as cellular telephones, personal digital assistants, mp-3 players, digital cameras, electronic paper, e-books, portable media, multimedia mobile phones, outdoor signs, advertising, ATM monitors, camouflage, dashboard displays, cockpit displays, and other displays where either electrochromic or light emitting displays are presently employed.

EXAMPLES

A device, as illustrated in FIG. 2, was constructed using interdigitated microelectrodes 201/202 with 5 μm spacing as purchased from AbTech Scientific (IME 0550.5-M-ITO-U). These microelectrodes were operated as the working electrode during an electrochromic mode by connecting, shorting, the digit pairs and electrochromic switching occurs at and between the electrode digits. During electroluminescent operation, one set of digits 201 acts as the anode while the other set of digits 202 acts as the cathode with light emission occurring between the digits. An active polymer blend layer 205 consisting of MEH-PPV/PEO/LiOTf, in a weight ratio of 1:1:0.18, respectively, was deposited on the IME interdigitated microelectrodes. The polymer blend was cast from a cyclohexanone solution onto the IME electrode by spin-coating the solution at 1000 rpm for 30 seconds.

The counter electrode 203 was a gold-coated Kapton film attached to a glass support. A film 207 of poly(3,4-ethylenedioxythiophene) (PEDOT) was electrochemically deposited on this counter electrode 203 from a 10 mM PEDOT solution, with 0.2 M tetrabutylammonium hexafluorophosphate (TBAPF$_6$), in propylene carbonate (PC) at a constant potential. An electrolyte soaked separator paper was used as the porous reflector 208 that allows ion diffusion during electrochromic operation. This separator hid the back counter electrode 203 allowing only the active MEH-PPV blend layer to be seen during EC and EL operation of the device. The electrolyte consisted of 5 mg/mL PEO and 0.9 mg/mL LiOTf. The electrolyte was dissolved in acetonitrile (ACN) and separately deposited on the active layer 205 at the interdigitated electrodes 201/202 and PEDOT layer 207 of the counter electrode 203. The ACN solvent was allowed to evaporate, leaving behind a solid electrolyte before device assembly. All electrodes were contacted using copper tape and the device was sealed on its edges with an epoxy resin. Device construction and operation was carried out in a glovebox under a dry argon atmosphere.

Figure 7:
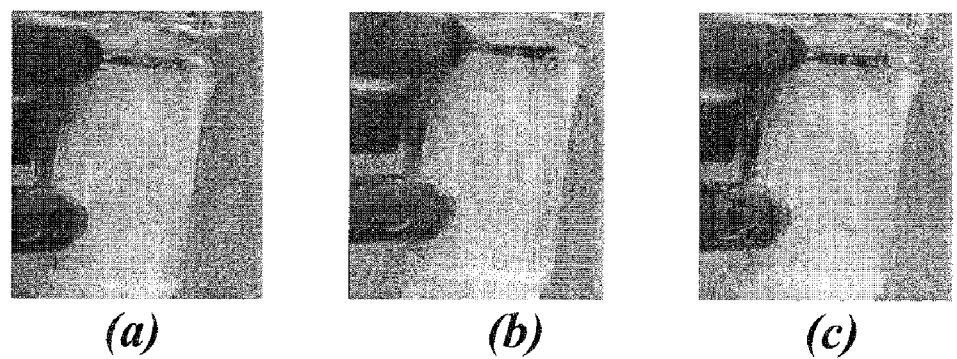
FIG. 7 displays color photographs of an exemplary EC/EL device according to an embodiment of the invention in an EC mode where 6(a) shows the neutral state before any oxidation, 6(b) shows the oxidized state upon application of current, and 6(c) the subsequent neutral state after reneutralization.

Electrochromic operation of the device was performed by shorting the pairs of interdigitated electrodes to form a single working electrode and electrically connecting the working and PEDOT-coated counter electrode, using an EG&G Model 273A potentiostat/galvanostat. As is seen in FIG. 7(a), the active polymer layer is orange in the neutral state. Upon application of a +3.5V bias across the device, the active layer in contact with the ITO IMEs changed to a blue color as seen in FIG. 7(b). This color change results from a doping process that introduces new states in the polymer bandgap, allowing lower energy transitions, with loss of the p–p* transition. When applying a negative bias (−0.8V) to the working electrode, the active polymer layer switched back to the orange neutral state, as shown in FIG. 1(c).

Figure 10:
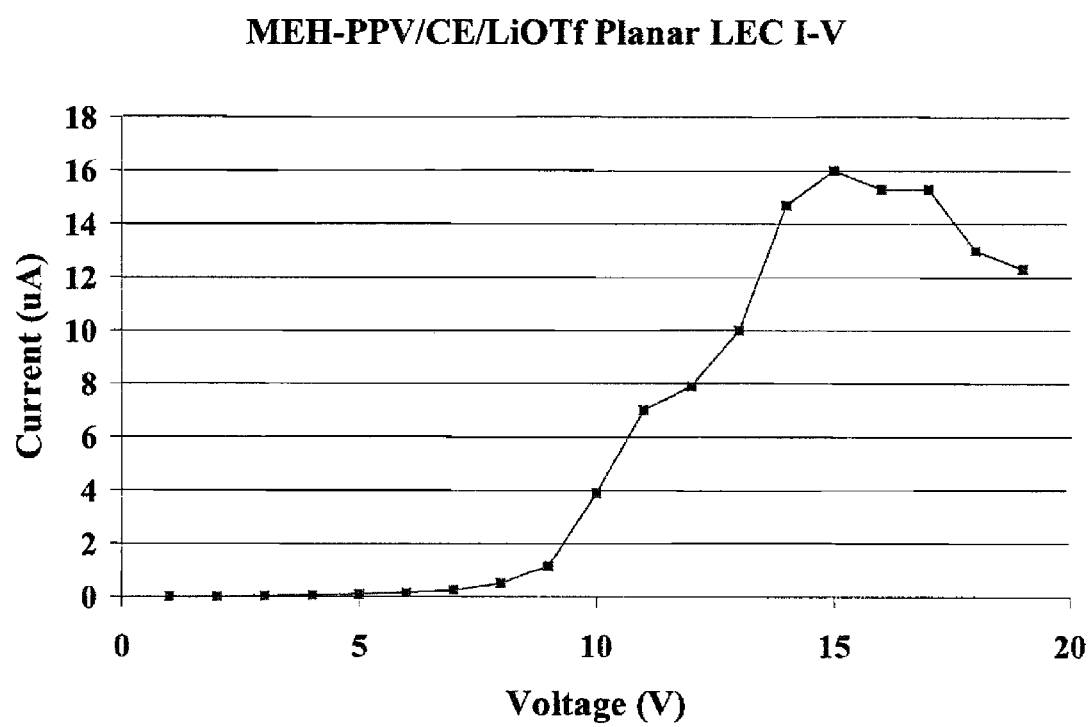
FIG. 10 is a plot of the current change for various applied voltages for the exemplary EC/EL device of FIG. 7 in its EL mode.

Electroluminescent operation of the device was performed by connecting one set of digits in the interdigitated electrode as the anode and the other set of digits as the cathode to a Keithley 2400 source measurement unit. Light emission was observed at an applied voltage of 9V and increased in intensity until a maximum at 15V The light-emission resulted from formation of a p–n junction within the polymer layer where the holes, created at the anode, and the electrons, created at the cathode, combine and radiatively decay, producing light. A plot of the current at each applied voltage is given in FIG. 10, showing the current increase after exceeding a voltage of 5V, with a maximum at 15 V, corresponding with the maximum observed light output.

All patents, patent applications, provisional applications, and publications referred to or cited herein, supra or infra, are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A dual electrochromic/electroluminescence (EC/EL) device comprising at least one pixel, said pixel comprising:
   an interdigitated electrode comprising a first electrode with a plurality of digits and a second electrode with a plurality of digits;
   an electroactive layer disposed on and between said first and second electrodes of said interdigitated electrode;
   a third electrode; and
   an electrolyte comprising layer disposed on and between said electroactive layer and said third electrode, wherein said electroactive layer provides electrochromic activity when an electrical bias is established between said interdigitated electrode and said third electrode, and electroluminescence when an electrical bias is established between said first and second electrodes of said interdigitated electrode, and wherein at least one of said interdigitated electrode and said third electrode, either alone or combined with said third electrode's supporting substrate, is transparent.

2. The dual EC/EL device of claim 1, further comprising a second electroactive layer disposed on said third electrode between said third electrode and said electrolyte comprising layer.

3. The dual EC/EL device of claim 2, wherein said second electroactive layer comprises a redox active polymer.

4. The dual EC/EL device of claim 3, wherein said redox active polymer is a conjugated polymer.

5. The dual EC/EL device of claim 4, wherein said conjugated polymer is poly(3,4-ethylenedioxythiophene) (PEDOT).

6. The dual EC/EL device of claim 2, wherein one of said interdigitated electrode and said third electrode, either alone or combined with said third electrode's supporting substrate, is specular reflective and wherein said electroactive layer and said second electroactive layer have an electrochromic mode where both of said layers have a colorless transparent state.

7. The dual EC/EL device of claim 1, further comprising a porous spacer within said electrolyte comprising layer.

8. The dual EC/EL device of claim 7, wherein said porous spacer is specular or diffuse reflective.

9. The dual EC/EL device of claim 7, wherein said porous spacer comprises cellulose or polytetrafluoroethylene.

10. The dual EC/EL device of claim 1, wherein said electroactive layer comprises a metal complex, a metal complex-containing polymer, or a conjugated polymer.

11. The dual EC/EL device of claim 10, wherein said metal complex-containing polymer comprises a polymer with bpy linked $Ru(bpy)_2$ units, wherein said bpy linked $Ru(bpy)_2$ units reside pendent to or within a polymer backbone, reside in a crosslinking unit, or any combination thereof.

12. The dual EC/EL device of claim 10, wherein said electroactive layer comprises a blend of said metal complex, said metal complex-containing polymer, or said conjugated polymer further comprising a matrix polymer.

13. The dual EC/EL device of claim 12, wherein said transition metal complex comprises $Ru(bpy)_3(PF_6)_2$ and said matrix polymer comprises polymethylmethacrylate (PMMA).

14. The dual EC/EL device of claim 10, wherein said electroactive layer contains an electrolyte.

15. The dual EC/EL device of claim 14, wherein said electrolyte comprises a solid electrolyte, a gel electrolyte, or an ionic liquid.

16. The dual EC/EL device of claim 1, wherein said digits of said first and second electrodes independently comprise gold, platinum, palladium, ITO, carbon nanotubes, or PEDOT:PSS.

17. The dual EC/EL device of claim 1, wherein said electrolyte comprising layer comprises a gel electrolyte, a solid electrolyte, or an ionic liquid.

18. The dual EC/EL device of claim 1, wherein one of said interdigitated electrode and said third electrode, either alone or combined with said third electrode's supporting substrate, is reflective.

19. The dual EC/EL device of claim 1 wherein at least one of said interdigitated electrode and said third electrode, either alone or combined with said third electrode's supporting substrate, is specular reflective and wherein said electroactive layer has a colorless transparent electrochromic mode.

20. The dual EC/EL device of claim 1, further comprising a means of applying an electrical bias between said combined first and second electrodes and said third electrode, and an electrical bias between said first and second electrodes.

21. The dual EC/EL device of claim 19, further comprising at least one light sensor.

* * * * *